(12) United States Patent
Taskar et al.

(10) Patent No.: US 6,998,281 B2
(45) Date of Patent: Feb. 14, 2006

(54) SOLID STATE LIGHTING DEVICE WITH REDUCED FORM FACTOR INCLUDING LED WITH DIRECTIONAL EMISSION AND PACKAGE WITH MICROOPTICS

(75) Inventors: Nikhil Ramesh Taskar, New York, NY (US); Vikram Bidare Krishnamurthy, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/401,686

(22) Filed: Mar. 31, 2003

(65) Prior Publication Data

US 2003/0209714 A1   Nov. 13, 2003

Related U.S. Application Data

(62) Division of application No. 09/686,910, filed on Oct. 12, 2000, now abandoned.

(51) Int. Cl.
 *H01L 21/56* (2006.01)
(52) U.S. Cl. ...................................................... 438/29
(58) Field of Classification Search ................. 438/26, 438/29, 35, 46, 114, 27, 32, 69, 71; 257/98
See application file for complete search history.

(56) References Cited

U.S. PATENT DOCUMENTS

| | | | |
|---|---|---|---|
| 4,661,419 A | 4/1987 | Nakamura | |
| 4,783,695 A | 11/1988 | Eichelberger et al. | |
| 4,933,042 A | 6/1990 | Eichelberger et al. | |
| 5,108,825 A | 4/1992 | Wojnarowski et al. | |
| 5,198,679 A | 3/1993 | Katoh et al. | |
| 5,226,053 A | 7/1993 | Cho et al. | |
| 5,353,498 A | 10/1994 | Fillion et al. | |
| 5,527,741 A | 6/1996 | Cole et al. | |
| 5,571,451 A | 11/1996 | Srivastava et al. | |
| 5,777,350 A * | 7/1998 | Nakamura et al. | 257/96 |
| 5,779,924 A | 7/1998 | Krames et al. | |
| 5,813,753 A | 9/1998 | Vriens et al. | |
| 5,847,507 A | 12/1998 | Butterworth et al. | |
| 5,851,063 A | 12/1998 | Doughty et al. | |
| 5,862,167 A | 1/1999 | Sassa et al. | |
| 5,895,932 A | 4/1999 | Bojarczuk, Jr. et al. | |
| 5,898,185 A | 4/1999 | Bojarczuk, Jr. et al. | |
| 5,925,897 A | 7/1999 | Oberman | |
| 5,966,393 A | 10/1999 | Hide et al. | |
| 5,977,612 A * | 11/1999 | Bour et al. | 257/618 |
| 5,998,925 A | 12/1999 | Shimizu et al. | |
| 6,046,465 A | 4/2000 | Wang et al. | |

(Continued)

OTHER PUBLICATIONS

Milton Ohring, The Materials Science of Thin Films, Academic Press: Boston 1992, p. 552.*

(Continued)

*Primary Examiner*—Carl Whitehead, Jr.
*Assistant Examiner*—Jennifer M. Dolan
(74) *Attorney, Agent, or Firm*—Fletcher Yoder

(57) ABSTRACT

A light emitting device containing an array of directional emission LEDs is provided. The directional emission LEDs of the array may be substrate emitting, lateral current injection, resonant cavity LEDs mounted in a flip-chip configuration. Each LED may emit a different color of light, such that the output of the array appears white to an observer. The LED array package may contain microoptical elements, such as a diffraction grating or microprisms, integrated into the light emitting surface of the package. The microoptical elements are used to mix the light beams emitted by individual LEDs in the array.

13 Claims, 9 Drawing Sheets

U.S. PATENT DOCUMENTS

| | | | |
|---|---|---|---|
| 6,066,861 A | | 5/2000 | Hohn et al. |
| 6,069,440 A | | 5/2000 | Shimizu et al. |
| 6,118,685 A | * | 9/2000 | Takeuchi et al. ............ 365/127 |
| 6,219,074 B1 | * | 4/2001 | Chosa et al. ................ 347/130 |
| 6,269,109 B1 | | 7/2001 | Jewell |
| 6,306,672 B1 | | 10/2001 | Kim |
| 6,319,808 B1 | | 11/2001 | Ho et al. |
| 6,320,206 B1 | | 11/2001 | Coman et al. |
| 6,423,562 B1 | | 7/2002 | Nido et al. |
| 6,495,862 B1 | * | 12/2002 | Okazaki et al. ............ 257/103 |

OTHER PUBLICATIONS

Keith Butler: Fluorescent Lamp Phosphors, pp. 98-107 (The Pennsylvania State University Press 1980).

S. Nakamura et al.: The Blue Laser Diode, pp. 216-221, 328-329 (Springer 1997).

G. Blasse et al.: Luminescent Materials, pp. 109-110 (Springer-Verlag 1994).

* cited by examiner

SOLID STATE LIGHTING DEVICE WITH REDUCED FORM FACTOR INCLUDING LED WITH DIRECTIONAL EMISSION AND PACKAGE WITH MICROOPTICS

This is a Divisional Application of application Ser. No. 09/686,910, filed Oct. 12, 2000, now abandoned, incorporated herein by reference.

BACKGROUND OF THE INVENTION

This invention relates generally to a semiconductor device and specifically to a directional emission light emitting diode ("LED") array with microoptic elements.

Semiconductor light emitting diodes are semiconductor chips that are mounted in a package and emit radiation in response to an applied voltage or current. These LEDs are used in a number of commercial applications such as automotive, display, safety/emergency and directed area lighting. A high brightness is desired for these applications.

White light emitting LED arrays are made by placing a plurality of LEDs into a package, where the individual LEDs emit different color lights. For example, by including red, green and blue emitting LEDs into an array, their combined output appears white to a human observer. Other LED arrays contain LEDs which emit only one color of light to form a solid state lighting device which emits a particular color of light.

However, the conventional LED arrays used for lighting applications suffer from several disadvantages. The LEDs used in conventional lighting applications emit light in all directions. Therefore, such LEDs must be mounted in a cup-shaped cavity in a carrier. The cavity contains a reflective material on its sidewalls to reflect the light toward the viewer. Furthermore, each conventional LED also requires a large dome lens to efficiently extract the light from the reflective carrier cavity. The cup-shaped carrier cavity and the dome lens increase the size of the package of each LED (i.e., increase the LED "form factor"). Therefore, the number of LEDs per square inch, and hence the light emitting density of the LED array, is decreased.

LED arrays that contain LEDs which emit different colors also require external optics that mix the individual colors to produce the desired single color output. For example, the external optics mix red, green and blue LED emission to obtain a white output. However, the external optics are relatively large. Therefore, the individual LEDs in the array have to be spaced apart at an undesirably large distance in order for the external optics to work properly. Therefore, the external optics require a smaller than desired number of LEDs per square inch, and hence the light emitting density of the LED array is decreased when the external optics are used.

FIG. 1 illustrates a conventional lateral current injection, top emitting (if the top electrode 17 is semi-transparent) or substrate emitting (if the top electrode 17 is reflective) GaN/InGaN LED 1. FIG. 2 illustrates a conventional LED array 21 with an undesirably high form factor due to the presence of the cup, dome lens and external optics. The conventional lateral current injection LED 1 contains a sapphire substrate 3, a GaN buffer layer 5, an n-type GaN contact layer 7, a GaInN ($Ga_{0.55}In_{0.45}N$, for example) quantum well active layer 9, a p-type AlGaN ($Al_{0.2}Ga_{0.8}N$, for example) barrier layer 11, a p-type GaN contact layer 13, a first electrode 15 which contacts the n-type contact layer 7 and a second electrode 17 which contacts the p-type contact layer 13.

This LED is a lateral current injection LED because the current is injected from the first electrode 15 into the active layer 9 laterally, since the first electrode 15 is laterally spaced from the active layer 9. Thus, in a lateral current injection LED, the active layer 9 and the first electrode 15 are located over the same (i.e., top) surface 19 of the lower contact layer 7. For example, in FIG. 1, the active layer 9 is located over the first lateral portion of the top surface 19 of the n-type contact layer 7 and the first electrode 15 contacts a second lateral contact portion of the top surface 19 of the n-type contact layer 7. In contrast, in a vertical current injection LED, the active layer and the first electrode are located over opposite sides of the lower contact layer and the current is injected vertically into the active layer, since the electrodes are located on opposite sides of the LED.

The packaged LED array 21 shown in FIG. 2 contains a plastic carrier 22 with leads 23 connected to the individual vertical current injection LED chips 24, 25 and 26. For example, LED 24 may be a red emitting LED, LED 25 may be a green emitting LED and LED 26 may be a blue emitting LED. The carrier 22 contains a plurality of cup-shaped LED carrier cavities 27. The sidewalls of the cavities are at least partially coated with a reflective metal 28. A relatively large dome lens 29 is placed over each LED and external optics 30 are located above the package 22. Thus, as illustrated in FIG. 2, the LEDs 24, 25 and 26 have to be located a relatively large distance apart in order to accommodate the reflector 28 coated cavities 27, the dome lenses 29 and the external optics 30. The present invention is directed to overcoming or at least reducing the problems set forth above.

BRIEF SUMMARY OF THE INVENTION

In accordance with one aspect of the present invention, there is provided a lateral current injection, directional emission light emitting diode, comprising a first conductivity type semiconductor contact layer, a semiconductor active layer over a first surface of the first conductivity type semiconductor contact layer, a second conductivity type semiconductor contact layer having a first surface over the active layer, a first electrode contacting the first surface of the first conductivity type semiconductor contact layer, a second electrode contacting the second conductivity type semiconductor contact layer, and wherein the light emitting diode emits radiation substantially in one direction.

In accordance with another aspect of the present invention, there is provided an array of lateral current injection, resonant cavity light emitting diodes, comprising:

i) a plurality of lateral current injection, resonant cavity light emitting diodes, each emitting at a different peak emission wavelength, each light emitting diode comprising:
   a) a transparent substrate;
   b) a first conductivity type III–V semiconductor contact layer, having a first surface containing a contact region and a second surface over the transparent substrate;
   c) a Bragg reflector over the first conductivity type contact layer;
   d) a first conductivity type III–V semiconductor confinement layer over the Bragg reflector;
   e) a III–V semiconductor quantum well active layer on the first conductivity type confinement layer and over the first surface of the first conductivity type contact layer;
   f) a second conductivity type III–V semiconductor contact layer, having a first surface over the active layer;
   g) a first metal electrode contacting the contact region of the first conductivity type contact layer; and h) a second reflective metal electrode contacting the entire second surface of the second conductivity type contact layer;

ii) a package containing a plurality of first leads, a plurality of second leads and a light emitting surface, wherein:

a) the first electrodes electrically contact the first leads;

b) the second electrodes electrically contact the second leads;

c) the transparent substrate of each light emitting diode is positioned toward the light emitting surface in a flip chip configuration; and iii) a microoptical element integrated into the package adjacent the light emitting surface.

In accordance with another aspect of the present invention, there is provided a method of making a light emitting diode, comprising forming a first conductivity type semiconductor contact layer on a substrate, forming a semiconductor active layer over a first surface of the first conductivity type semiconductor contact layer, forming a second conductivity type semiconductor contact layer over the active layer, patterning the first conductivity type semiconductor layer, the second conductivity type semiconductor contact layer and the active layer, forming a first metal containing electrode contacting the first conductivity type semiconductor contact layer, forming a second metal containing electrode contacting the second conductivity type semiconductor contact layer, and forming a package containing at least one integrated microoptical element above the light emitting diode.

DETAILED DESCRIPTION OF THE INVENTION

In view of the problems in the prior art, it is desirable to obtain an LED array with a lower form factor without sacrificing the light extraction efficiency and/or the color mixing. The present inventors have discovered that the reflector cavity and the dome lens may be omitted without substantially lowering the light extraction efficiency if a directional emission LED is used in the light emitting device. Preferably, the directional emission LED is a lateral current injection, resonant cavity LED. Furthermore, the lower form factor may be achieved while still retaining the color mixing ability by integrating color mixing microoptical elements directly into the LED package.

A. The Resonant Cavity LED of the First Preferred Embodiment

Resonant cavity LEDs ("RCLEDs", also known as microcavity LEDs) are described in U.S. Pat. Nos. 5,226,053 and 5,779,924, which are incorporated herein by reference. However, these RCLEDs are vertical current injection RCLEDs and thus have one electrode formed on the light emitting surface. While such vertical current injection infrared emitting RCLEDs are preferred for fiber optic applications, as described in U.S. Pat. No. 5,226,053, such LEDs are not optimal for solid state light emitting devices because the electrode on the light emitting surface interferes with light extraction from the active layer. Therefore, while vertical current injection LEDs may be used in the LED array according to less preferred embodiments of the present invention, lateral current injection resonant cavity LEDs are preferably used in the LED array.

Figure 1:
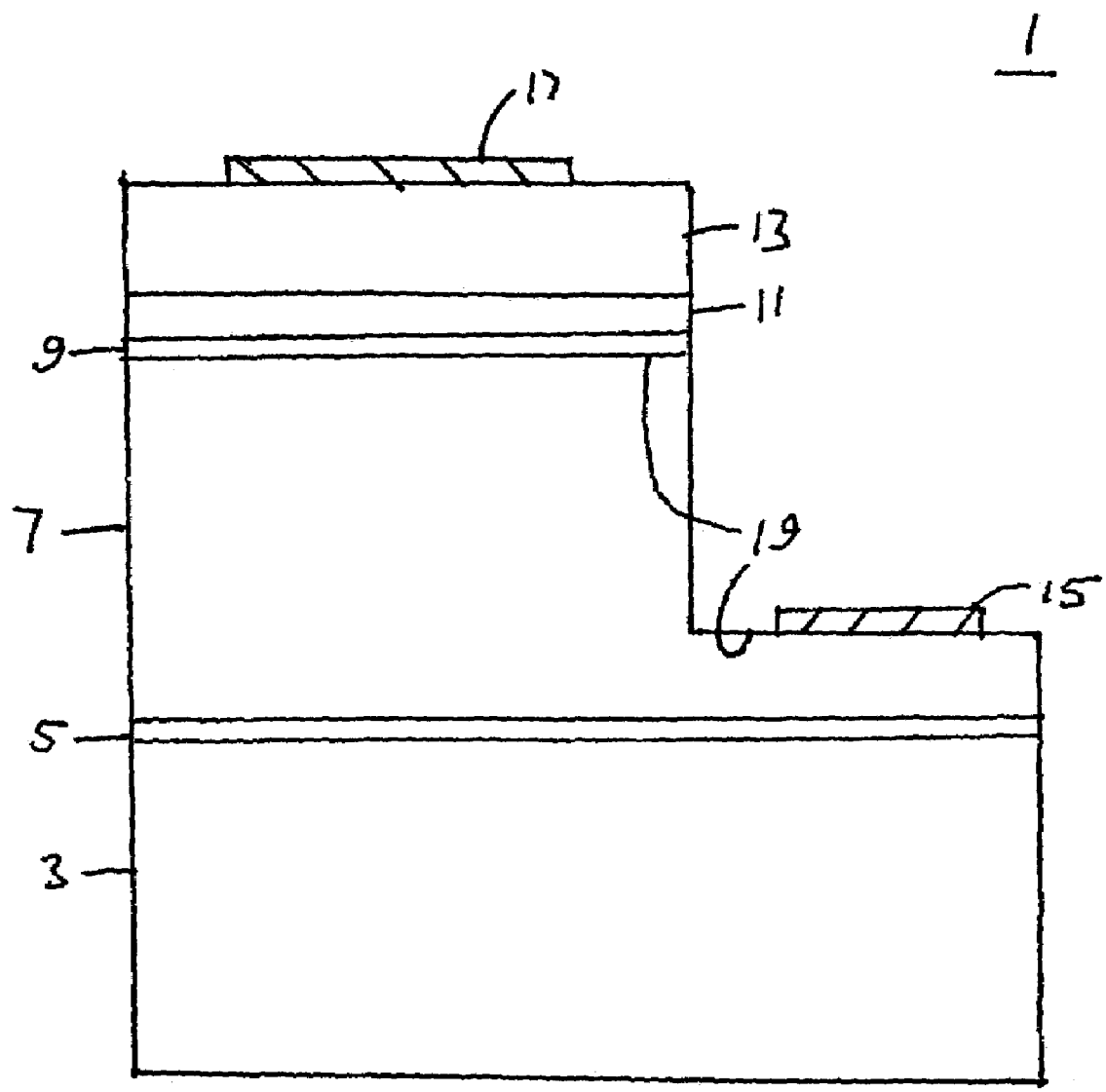
FIG. 1 is side cross sectional view of a prior art LED.
Figure 2:
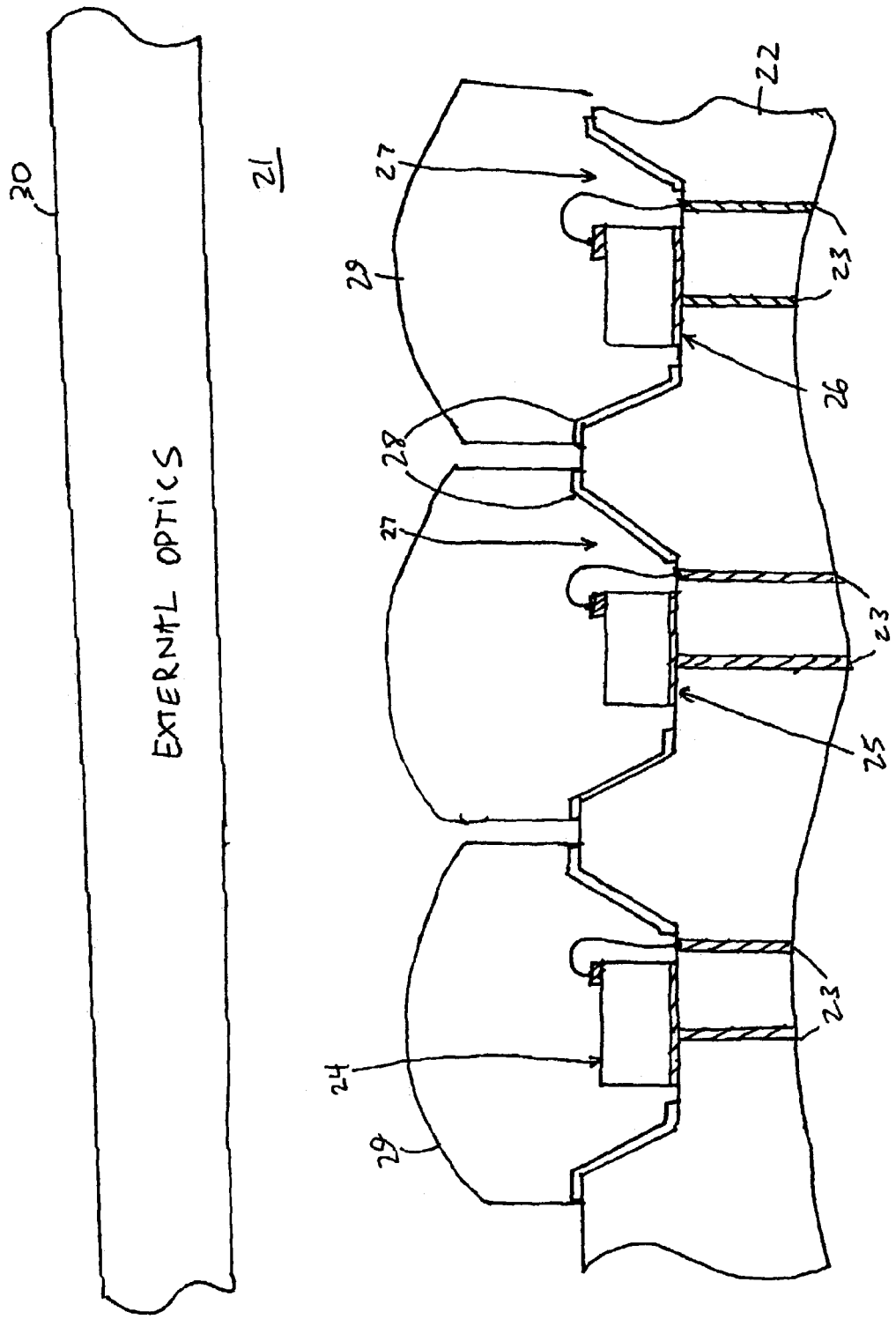
FIG. 2 is a side cross sectional view of a prior art LED array.
Figure 3:
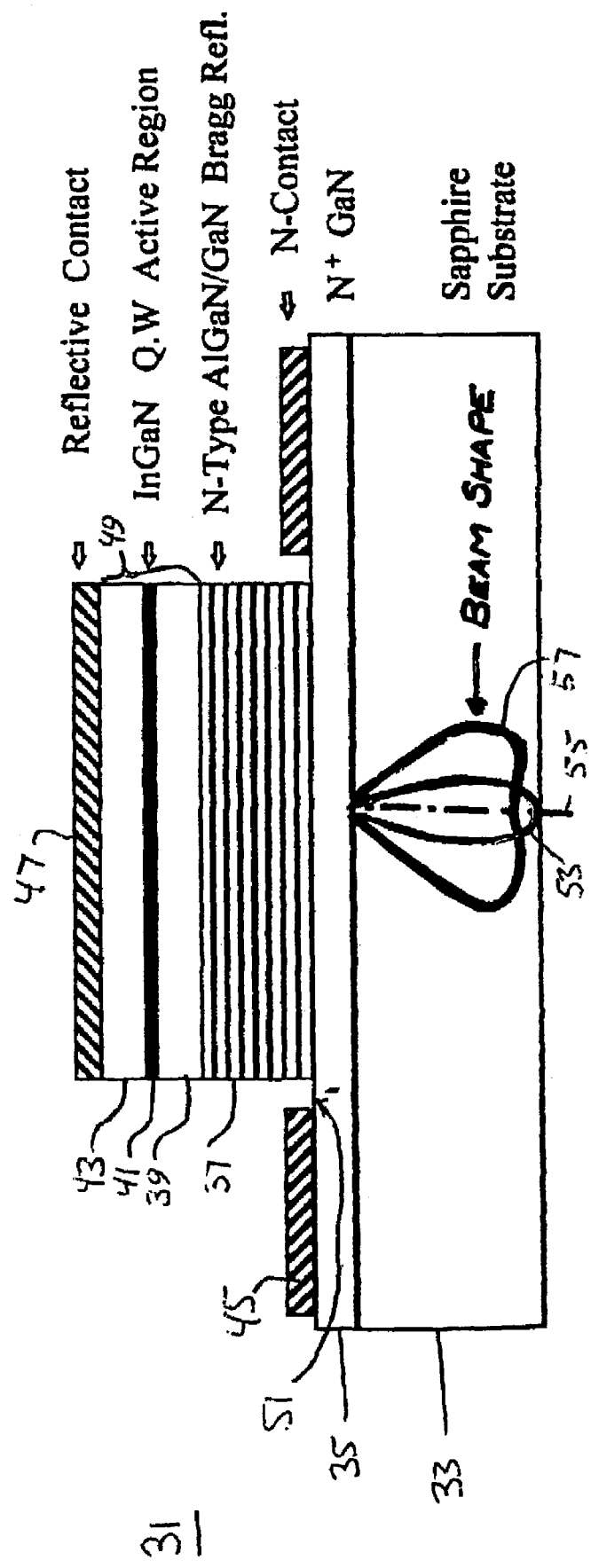
FIG. 3 is a side cross sectional view of an LED according to one preferred embodiment of the present invention.

FIG. 3 illustrates a lateral current injection, substrate emitting GaN/InGaN resonant cavity LED 31, according to a first preferred embodiment of the present invention. The RCLED 31 contains a transparent substrate 33, an n-type contact layer 35, a Bragg reflector 37, an n-type confinement layer 39, an active layer 41, a p-type confinement/contact layer 43, a first electrode 45 which contacts the n-type contact layer 35 and a second electrode 47 which contacts the p-type contact layer 43.

The transparent substrate 33 may be a 125 to 500 micron thick insulating substrate, such as a sapphire substrate or another suitable material, such as silicon carbide. The n-type contact layer 35 may be a III–V semiconductor layer containing Ga and N, such as a 4 to 200 micron thick n-type GaN layer (also known as a window layer when its thickness is greater than 20 microns) doped with silicon or other n-type dopant(s). Preferably, the n-type contact layer is 4 to 10 microns thick. The n-type contact layer is heavily ($N^+$) doped, to establish an ohmic contact with electrode 45. The preferred carrier concentration of layer 35 is about $1 \times 10^{18}$ to about $5 \times 10^{19}$ $cm^{-3}$.

The Bragg reflector 37 is preferably a semiconductor distributed Bragg reflector (DBR) mirror comprising a plurality of pairs of semiconductor layers having a different index of refraction. Preferably, the first member of the pair is a highly n-type doped AlGaN layer and the second member of the pair is a highly n-type doped GaN layer. Preferably, there are between 10 and 40 such pairs. In order to form a directional emission that is substantially in one direction, the thickness of each AlGaN and GaN layer should be equal to $\lambda_0/4n$, where n is the refractive index and $\lambda_0$ is the RCLED tuned peak radiation output wavelength (in air), which will be described in more detail below. The Bragg reflector may have a medium reflectivity of about 50 to about 75%, preferably, 60 to 70%.

Figure 4:
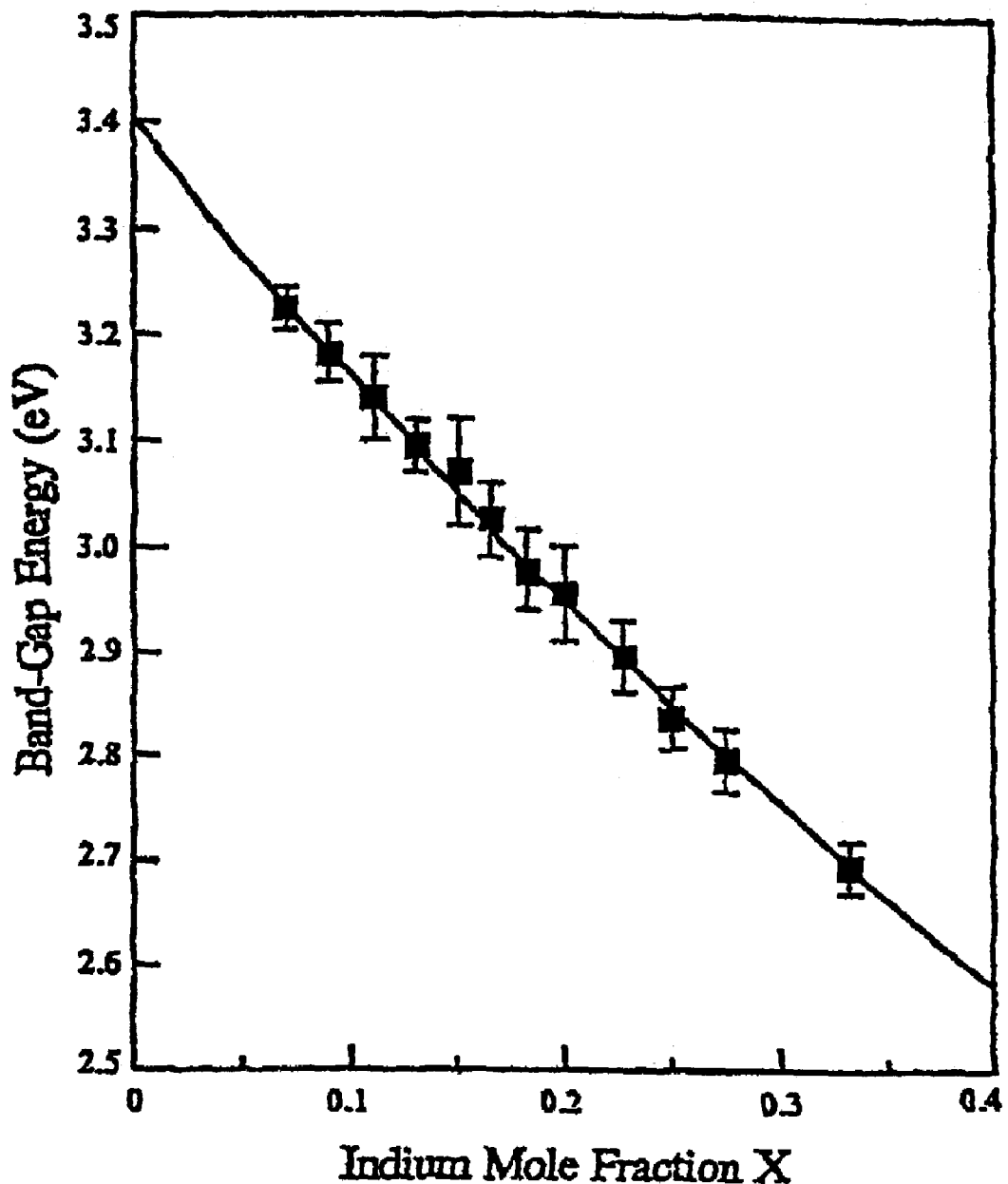
FIG. 4 is a graph of the band gap of the GaInN active layer versus the indium mole fraction of the active layer.

The n-type confinement layer 39 (also known as cladding or barrier layer) is preferably a medium n-type doped GaN layer. The active layer 41 is preferably a single or multiple quantum well layer containing Ga, In and N, such as a 10 to 100 angstrom $Ga_{1-x}In_xN$ quantum well layer. The active layer is preferably undoped, but may be n-doped with silicon, if desired. The indium mole fraction, x, may be selected to produce a desired wavelength of light to be emitted by the LED. FIG. 4 illustrates the correlation of the $Ga_{1-x}In_xN$ band gap energy to the mole fraction x of indium (the band gap to mole fraction correlation in GaInN LEDs per se is described on pages 295 to 305 of S. Shionoya et al, *Phosphor Handbook*, CRC Press 1999, incorporated herein by reference). The band gap energy, $E_g$, may be selected based on the desired emission wavelength, $\lambda$, from the following simple relationship: $\lambda=hc/E_g$, where h is Plank's constant and c is the speed of light, by adjusting the indium mole fraction in the active layer. The emission wavelength of $Ga_{1-x}In_xN$ may range from the ultraviolet (365 nm to 400 nm) to blue (400 nm to 475 nm), to even green (500 nm to 560 nm) and red (600 nm to 650 nm) with the addition and/or substitution of other elements such as Al, As and P.

The p-type confinement/contact layer 43 may be a III–V semiconductor layer containing Ga and N, such as a highly doped (P+) p-type GaN layer doped with magnesium or other p-type dopant(s). The preferred carrier concentration of layer 43 is about $5\times10^{17}$ to about $1\times10^{19}$ cm$^{-3}$. Layer 43 may also comprise two sublayers, if desired. The lower portion of layer 43 adjacent to the active layer 41 may be a medium p-type doped AlInGaN, AlGaN or GaN confinement layer and the upper portion of layer 43 may be a highly p-type doped contact layer which makes an ohmic contact with electrode 47.

The active layer 41, the two confinement layers 39, 43 and a transparent portion of the electrode 47, if any, in contact with layer 43, comprise the Fabry-Perot resonant microcavity 49. In order to obtain emission in substantially one direction, the thickness of the microcavity, t, is selected such that:

$$\phi_{OUTPUT}+\phi_{BACK}+(4*\pi*n*t)/\lambda_o=2*N*\pi \quad (1)$$

which may be rewritten to isolate t:

$$t=[\lambda_o*(2*N*\pi-\phi_{OUTPUT}-\phi_{BACK})]/(4*\pi*n) \quad (2)$$

where $\lambda_o$ is the tuned peak output wavelength in air, N is an integer (preferably N=1, 2, 3, 4 or 5), n is the effective refractive index of the microcavity, and $\phi_{OUTPUT}$ and $\phi_{BACK}$ are the phase changes during reflection at the output and back mirror, respectively. The term (n*t) is the effective optical thickness of the microcavity, which is given by the following formula:

$$n*t=n_1*t_1+n_2*t_2+n_3*t_3+\ldots n_z*t_z \quad (3)$$

where $n_i$ and $t_i$ are the refractive index and thickness of each layer in the microcavity, respectively, and z is the total number of layers in the microcavity. Thus, the total thickness of the microcavity 49 is the sum of all of its layers:

$$t=t_1+t_2+t_3+\ldots +t_z \quad (4)$$

However, if desired, the thickness of the microcavity, t, selected from formulas (1) or (2) may be roughly approximated according to the following formula (5):

$$t=N*\lambda_0/2n \quad (5)$$

where N is an integer, preferably a low integer (i.e., N=1, 2, 3, 4 or 5).

The phase change $\phi_{OUTPUT}$ of a DBR mirror, such as the Bragg reflector 37, is either so small as to be negligible, if the first layer of DBR mirror (the layer in closest proximity to the confinement layer 39) is a high index of refraction layer, or $\phi_{OUTPUT}=\pi/2$ if the first layer of the DBR mirror is a low index of refraction layer.

The phase change $\phi_{BACK}$ of a metallic mirror, such as electrode 47, is determined by the equation:

$$\phi_{BACK}=ArcTan(2*n*k_M/(n^2-n_M^2-k_M^2)) \quad (6)$$

Where $n_M$, $k_M$ are real and imaginary parts of the refractive index of the mirror (i.e., of the electrode 47) and n is the refractive index of the cavity 49.

The first electrode 45 preferably comprises an Al layer and a Ti layer. The first electrode contacts the top surface 51 of the n-type contact layer. Furthermore, the active layer 41 is also positioned above the top surface 51 of the n-type contact layer. Hence, RCLED 31 is a lateral current injection, substrate emitting resonant cavity LED. The lateral current injection LED is advantageous over the prior art vertical current injection LEDs because the bottom, light emitting surface of the substrate 33 does not contain an electrode which interferes with light extraction.

The second electrode 47 preferably substantially covers the entire top surface of the p-type contact layer 43 and comprises a reflective metal layer. For example, the second electrode 47 may contain a thin transparent nickel oxide, or a gold doped nickel oxide contact layer of 100 angstroms or less and a reflective Al layer over the nickel oxide layer. In order for the LED 31 to be substrate emitting, the reflectivity of electrode 47 ($R_{BACK}$) should be higher than the reflectivity of the Bragg reflector 37 ($R_{OUTPUT}$):

$$1-R_{OUTPUT}>1-R_{BACK} \quad (7)$$

For example, the electrode 47 reflectivity may be about 75 to about 95%, preferably 85 to 95%. As discussed above, the Bragg reflector may have a reflectivity of about 50 to about 75%, preferably, 60 to 70%.

In one alternative embodiment, the second electrode 47 may comprise a thin, transparent nickel oxide layer, with or without Au dispersed in it, with sufficient lateral electrical conductivity to enable current spreading. The entire area of the second electrode 47, except where it is contacted by a second lead, is coated with a top Bragg reflector. This top Bragg reflector could be comprised of alternating, electrically insulating dielectric layers, such as silicon dioxide and silicon nitride. Titanium oxide, tantalum oxide, hafnium oxide or aluminum oxide may also be used instead of silicon nitride. The top Bragg reflector should have a higher reflectivity than the bottom Bragg reflector 37 for a substrate emitting RCLED. However, if a top emitting RCLED is desired, where the radiation is emitted through the top transparent electrode 47, then the top Bragg reflector should have a lower reflectivity than the bottom Bragg reflector 37.

In another alternative embodiment, a second, highly reflecting, yet electrically conductive, Bragg reflector having a reflectivity of between 85 and >99%, preferably between 95 and 99%, may be added between electrode 47 and layer 43. The second Bragg reflector would thus perform the function of reflecting the light toward the substrate 33 more efficiently than electrode 47 if the reflector's reflectivity is higher than that of the electrode 47. Hence, the top electrode 47 may be made non-reflective in this embodiment.

An optional GaN buffer layer may also be added between the substrate 33 and the n-type contact layer 35, if desired. Other layers, such as waveguide layers may also be added, if desired. For example, both the n-type confinement layer 39 and p-type confinement/contact layer 43 could be comprised of multiple layers, including cladding layers. However, all the layers in the microcavity 49, including the active region 41 and the transparent NiO top electrode (if present), should have a combined thickness that satisfies equations 1, 2 or 5. Furthermore, if desired, the transparent substrate 33 may be omitted, and the active layer 39 may be fabricated directly on a thick (over 100 microns thick) n-type GaN layer 35. In other words, layer 35 may be used as the substrate. The n and p-type conductivities of contact layers 35/37/39 and 43 may also be reversed, if desired and feasible from a manufacturing standpoint.

Other III–V, II–VI or IV—IV semiconductor layers, such as GaAs, GaAlAs, GaP, GaAsP, ZnSe, ZnSSe, SiC, etc., may be used instead of the GaN based III–V semiconductor layers to form the LED 31. Furthermore, if the LED 31 is used in an array of plural LEDs emitting at different colors, then the GaN/InGaN based LED 31 may be used as a blue, green, yellow and perhaps even a red emitting LED, a AlInGaP resonant cavity lateral current injection LED may be used as an amber or red emitting LED, and/or an AlGaAs resonant cavity lateral current injection LED may be used as a red emitting LED.

The resonant cavity LED 31 operates as follows. The use of the Fabry-Perot resonant cavity 49 between the reflectors 37, 47 confines the radiation emitted from the active layer to the allowed modes of the cavity. The radiation resonates in the cavity by back and forth reflection between the reflectors 37, 47. The optical mode density in a Fabry-Perot cavity. 49 is strongly enhanced for on-resonance wavelengths. While off-resonance optical transitions have a longer lifetime, on-resonance transitions have a shorter lifetime. The LED radiation is therefore "channeled" into the allowed optical resonance modes of the cavity. As a consequence, resonant standing radiation waves are generated in the cavity 49 and a portion of the resonant radiation is emitted substantially in one direction through the Bragg reflector 37 on each bounce. By positioning the active region 41 at a maxima of the standing wave, the active region 41 does not absorb the radiation that is reflected through it, according to the following formula:

$$2*\alpha*t \ll 1 - R_{OUTPUT} \quad (8)$$

where $\alpha$ and t are the optical absorption coefficient and thickness of the microcavity, respectively. Furthermore, $$\alpha*t = \alpha_1*t_1 + \alpha_2*t_2 + \alpha_3*t_3 + \ldots + \alpha_z*t_z \quad (9)$$

where $\alpha_i$ and $t_i$ are the optical absorption coefficient and thickness of each layer in the microcavity, respectively.

For example, the desired tuned peak radiation output wavelength, $\lambda_0$, of the light emitting diode is determined. If emission in one axial direction is desired, the band gap of the GaInN quantum well active layer is selected to emit radiation at a peak wavelength of $\lambda_0$, as described above with respect to FIG. 4. The active region 41 is positioned in the cavity 49 at a position corresponding to maxima of the standing wave. The thickness of the individual layers forming a Bragg reflector 37 is selected to equal to $\lambda_0/4n$, and the thickness, t, of the cavity 49 is selected according to formulas (1), (2) or (5), above. When the band gap of the active layer 41 is chosen to emit radiation having a wavelength $\lambda_0$, the RCLED 31 is in a tuned state. Such an LED has a narrow emission profile 53 containing a single intensity maximum and is directed in one direction along the axis 55 perpendicular to the thickness of the cavity 49, as illustrated in FIG. 3.

If a slightly wider emission profile is desired, then the RCLED 31 may be detuned. The RCLED 31 is detuned by selecting the active layer band gap to emit radiation having a peak wavelength of $\lambda_1 < \lambda_0$, or by locating the active layer slightly above or below the location of the standing wave maxima in the cavity 49. For example, if the active layer 41 emits radiation having a peak emission wavelength $\lambda_1 < \lambda_0$, while the thickness of the individual layers forming the Bragg reflector 37 is selected to equal to $\lambda_0/4n$, and the thickness of the cavity 49 is selected according formulas (1), (2) or (5), then the RCLED has a detuned emission profile 57, as illustrated in FIG. 3. The emission profile contains two intensity maxima which are inclined by a small angle away from axis 55. Thus, a detuned RCLED 31 emits radiation substantially in one direction. Other off-axis emission profiles may be obtained as desired by varying the location and the peak emission wavelength of the active layer 41. Thus, the angular distribution of the LED emission may be selected by controlling the cavity design and active layer composition.

B. The LED with Reflective Electrodes of the Second Preferred Embodiment

While a resonant cavity LED 31 of the first preferred embodiment is preferred as the directional emission LED, other directional emission LEDs may be used. For example, an LED 61 containing a reflective layer on the LED sidewalls according to the second preferred embodiment, as illustrated in FIG. 5, may be used instead.

Figure 5:
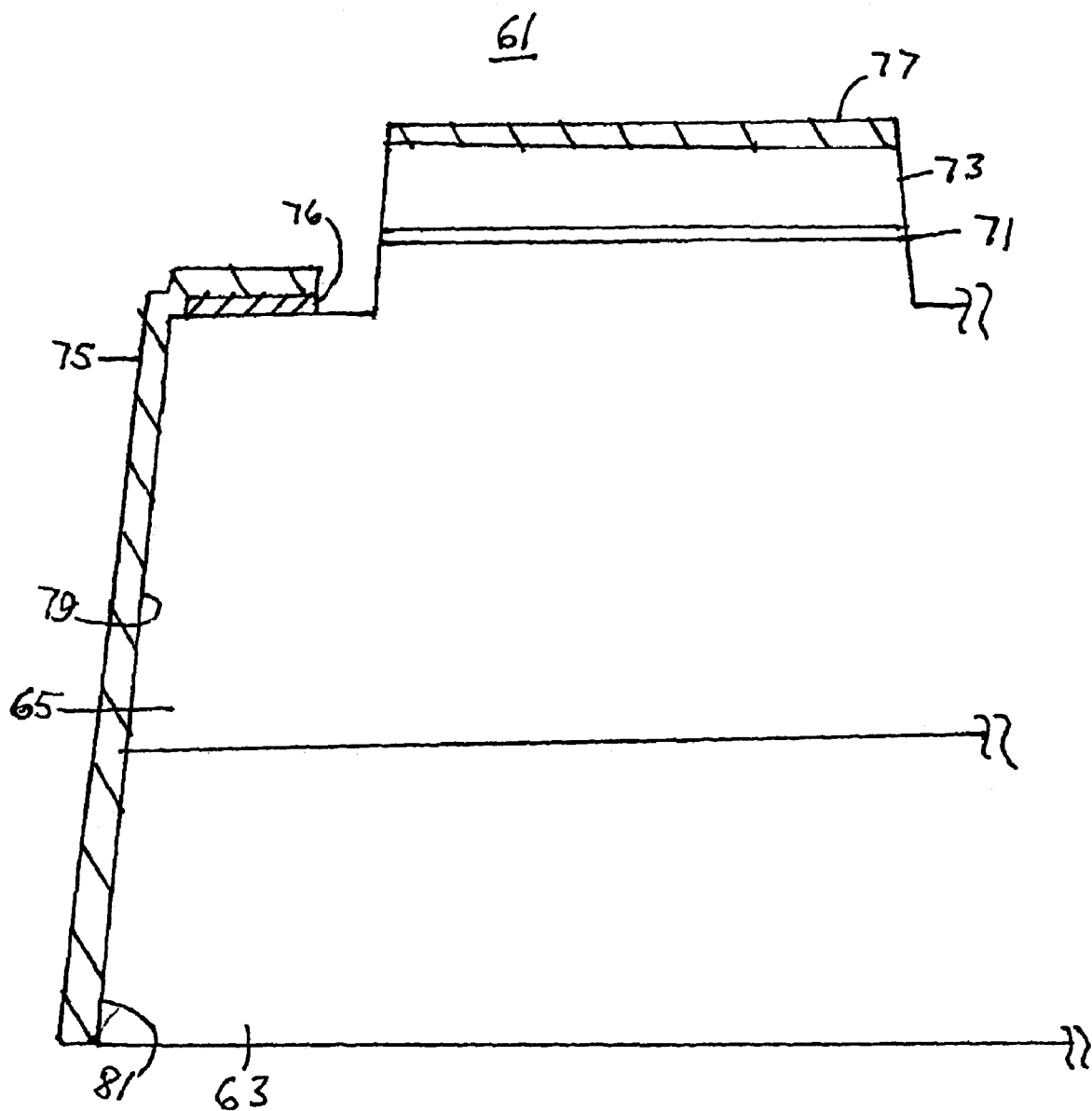
FIG. 5 is a side cross sectional view of an LED according to another preferred embodiment of the present invention.

FIG. 5 illustrates a lateral current injection, substrate emitting LED 61 having a beveled contact layer and substrate sidewalls, according to a second preferred embodiment of the present invention. The LED 61 contains a transparent substrate 63, an n-type contact layer 65, an active layer 71, a p-type contact layer 73, a first electrode 75 which contacts the n-type contact layer 65 and a second electrode 77 which contacts the p-type contact layer 73.

The substrate 63 may be a 125 to 500 micron thick sapphire substrate. The n-type contact layer 65 may be a III–V semiconductor layer containing Ga and N, such as a 4 to 200 micron thick n-type GaN layer (also known as a window layer) doped with silicon or other n-type dopant(s). Preferably, the n-type contact layer is 50 to 200 microns thick to prevent or reduce the waveguiding effects which lead to internal reabsorption of light. Preferably the substrate is 125 to 200 microns thick when the n-type GaN layer is 50 to 200 microns thick. The substrate 63 and the n-type GaN contact layer 65 may have any desired cross-sectional shape. In one preferred embodiment of the present invention, the n-type GaN contact layer 65 forms a mesa having a round or oval (i.e., egg shaped or elliptical) cross sectional shape, while the substrate 63 has a polygonal shape.

The p-type contact layer 73 may be a III–V semiconductor layer containing Ga and N, such as a 0.05 to 10 micron thick p-type GaN layer doped with magnesium or other p-type dopant(s). It should be noted that the n and p type contact layers 65 and 73, respectively, may include homogenous semiconductor films or composite films having two or more sublayers having different concentrations of the n and p-type dopants, respectively.

The active layer 71 may be a III–V semiconductor layer or one or more quantum well layers containing Ga, In and N, such as a 10 to 100 angstrom $Ga_{1-x}In_xN$ quantum well layer(s). The active layer is preferably undoped, but may be n-doped with silicon, if desired. The indium mole fraction, x, may be selected to produce a desired wavelength of light to be emitted by the LED, as illustrated in FIG. 4.

If desired, an optional GaN buffer layer may be added between the substrate 63 and the n-type contact layer 65. If desired optional p-type and/or n-type barrier layers may be added above and/or below the active layer 71. Undoped or doped barrier layers may be added between plural quantum wells if the active layer 71 comprises plural quantum wells. Furthermore, other III–V, II–VI and IV—IV semiconductor layers may be used instead of GaN and GaInN layers. The LED 61 preferably emits blue of UV radiation, but may also emit any other type of radiation, such as green, yellow or red light. The n and p-type conductivities of contact layers 65 and 73 may also be reversed, if desired and feasible from a manufacturing standpoint.

The second electrode 77 preferably substantially covers the entire top surface of the p-type contact layer 73 and comprises a reflective metal layer. For example, the second electrode 77 may contain a thin transparent nickel oxide contact layer of 100 angstroms or less, with or without Au dispersed in it, and a reflective Al layer over the nickel oxide layer.

If desired, in an alternative embodiment, the second electrode 77 may contain a thin transparent nickel oxide layer, with or without Au dispersed in it, with sufficient lateral electrical conductivity to enable current spreading. The entire area of the second electrode, except where it is contacted by the second lead, is coated with a top Bragg reflector. This top Bragg reflector could be comprised of alternating, electrically insulating dielectric layers such as silicon dioxide and silicon nitride. Titanium oxide, tantalum oxide, hafnium oxide or aluminum oxide may also be used instead of silicon nitride.

The first electrode 75 is reflective and extends over at least a portion of the n-type GaN contact layer sidewall(s) 79. Preferably, the reflective first electrode 75 contacts a substantial portion of the sidewall(s) 79. Most preferably, electrode 75 extends around the entire surface of the sidewall(s) 79 and the sidewalls 81 of the substrate 63 to reflect light toward the bottom surface of the substrate in substantially one direction to be observed by the viewer.

As shown in FIG. 5, the reflective first electrode 75 is in contact with the entire sidewall 79 of the n-type contact layer 65, except for the portion above the contact portion of surface, adjacent to the active layer 71. The reflective electrode 75 may comprise any reflective metal, such as silver or aluminum, which is capable of reflecting the light. If the reflective electrode 75 comprises silver, then an additional contact metallization 76 comprising Al and/or Ti may be added below electrode 75 in contact with the top surface of layer 65, as shown in FIG. 5. If the reflective electrode comprises Al, then the contact metallization 76 may comprise Ti. If desired, the contact metallization 76 may be omitted or placed over the reflective electrode 75. The reflective electrode 75 can reflect light beams which are incident on the sidewalls 79, 81 at an angle less than the critical angle. Thus, the reflective electrode 75 illustrated in FIG. 5 may be formed on straight sidewalls or beveled sidewalls 79, 81.

In an alternative embodiment, an electrically insulating dielectric layer, for example, silicon dioxide, silicon nitride, aluminum oxide, hafnium oxide. tantalum oxide or titanium oxide, could cover the sidewalls of the layers 73, 71. The insulating layer may also partially cover the area of electrode 77 adjacent to the sidewall of layers 71 and 73. The reflective first electrode 75 may then be formed to cover the entire sidewall of layers 71 and 73 and partially overlap the second electrode 77, with an electrically insulating dielectric layer in between the electrodes.

In another alternative embodiment, the insulating layer may be placed between the reflective first electrode 75 and surface of the sidewall 79. In yet another alternative embodiment, the dielectric layer may be placed on the sidewalls of the microcavity 49 of the RCLED 31 illustrated in FIG. 3.

C. The LED Array

Figure 6:
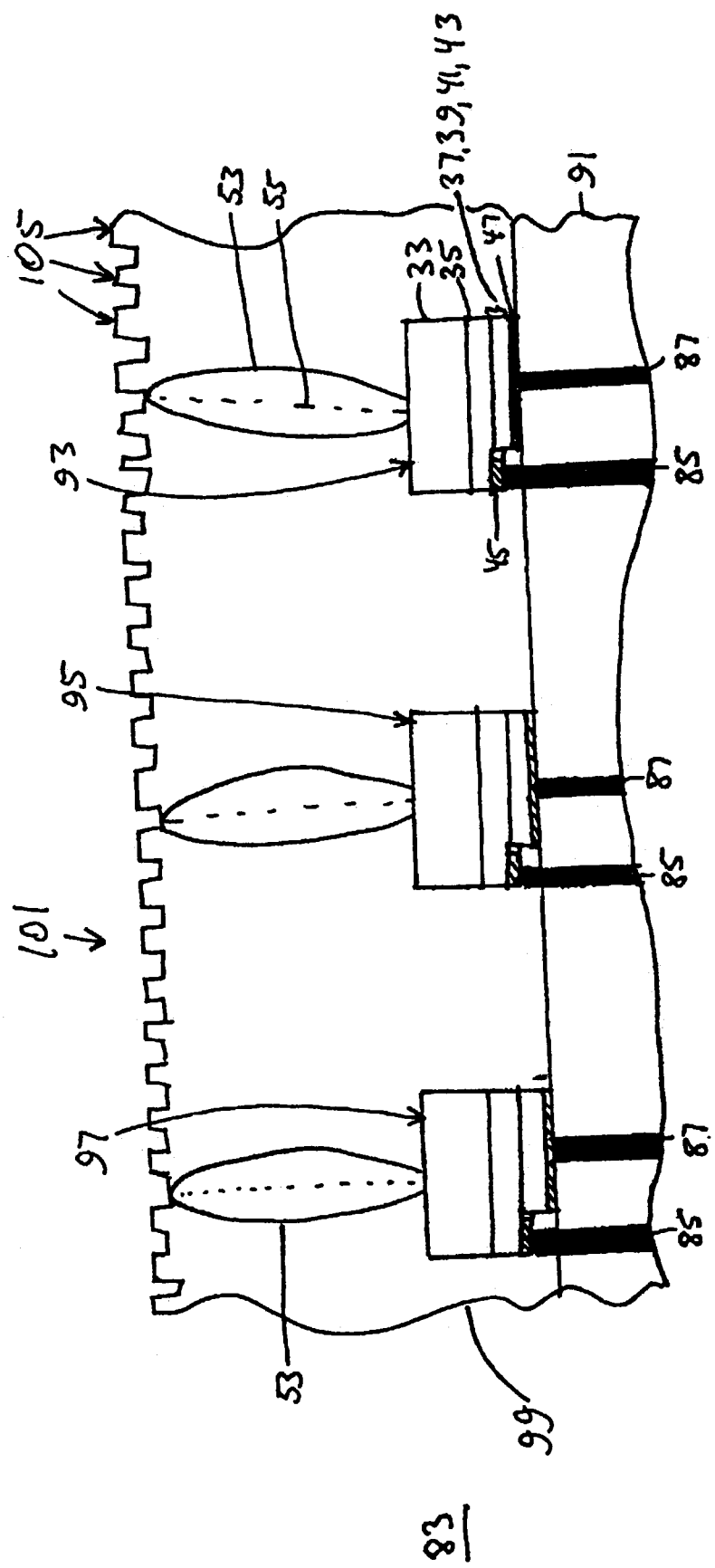
FIGS. 6 and 7 are side cross sectional views of packaged LED arrays according to preferred embodiments of the present invention.

The LED chips 31 and 61 of the first or second preferred embodiment are preferably packaged in an LED array in a flip chip configuration, as illustrated in FIG. 6. The package 83 contains a first lead 85, a second lead 87 and a light emitting surface 101. The first electrode 45, 75 electrically contacts the first lead 85. The second electrode 47, 77 electrically contacts the second lead 87. The bottom surface of the transparent substrate 33, 63 is positioned toward the light emitting surface 101 of the package 83. Thus, the electrodes and the leads are not in the way of the light beams 53 emitted by the LED chips.

The package 83 may have any shape, such as a chip carrier configuration, an example of which is illustrated in FIG. 6. Preferably, the chip carrier comprises a plastic carrier 91 supporting a plurality of LED chips 31, 61. Alternatively, the chip carrier could be comprised of an electrically insulating, but thermally conductive carrier, such as aluminum nitride or diamond. If desired, an array of a plurality of LEDs may be formed on the same sapphire substrate 33, 63 prior to mounting the substrate on the carrier 91. Furthermore, each LED chip may be mounted on a separate carrier 91 in the packaged array 83, as illustrated in FIG. 7.

FIG. 6 illustrates a cut away view of an LED array containing LED chips 93, 95 and 97. The LED chips 93, 95, 97 are directional emission LEDs, such as the RCLEDs illustrated in FIG. 3 or the LEDs illustrated in FIG. 5. To form a white emitting LED array, each LED may emit a different color of light. For example, LED 93 may emit blue light, LED 95 may emit green light and LED 97 may emit red light, which together appear white to an observer. Alternatively, the LEDs 93, 95 and 97 may emit the same color light, if a colored light output is desired, such as in a green traffic light. Furthermore, a phosphor, such as yellow emitting YAG:$Ce^{3+}$, may be placed above the LEDs, such as blue emitting LEDs, such that the radiation output from the phosphor and the LEDs appears white. The phosphor may be coated as a thin layer on the light emitting surface of the substrate 33, 63 or intermixed into the encapsulating material. It should be noted that the array preferably contains more than three LEDs illustrated in FIG. 6.

The package 83 contains an encapsulating material 99 having a light emitting surface 101. The encapsulating material may be any known thermoplastic or thermoset encapsulating material, such as epoxy or silicone, that is transparent to the LED radiation. Because of the directional nature of the LED emission 53 (i.e., a deviation of less than the package-air critical angle), no dome lens with a large angle of curvature is required. Likewise, no cup shaped LED carrier cavities coated with a reflective metal are required. Therefore, the package dimensions (i.e., height and width) and the form factor are reduced because the directional emitting LEDs can be placed closer together and the encapsulating material 99 thickness can be reduced. This further improves the uniformity of the color and the intensity of the light observed by the viewer. Furthermore, the LED manufacturing process is simplified, because the LEDs can be placed on a flat carrier 91 and a spin-on encapsulating material 99 with a flat light emitting surface 101 may be formed above the LEDs, as illustrated in FIG. 6. For example, Hysol 4000® spin-on epoxy may be used as the encapsulating material 99. Preferably, the entire package 83 is about 0.3 mm to about 5 mm, preferably 1 to 3 mm thick, and has an area of about 1 to about 300 $mm^2$, preferably 50 to 100 $mm^2$.

Figure 7:
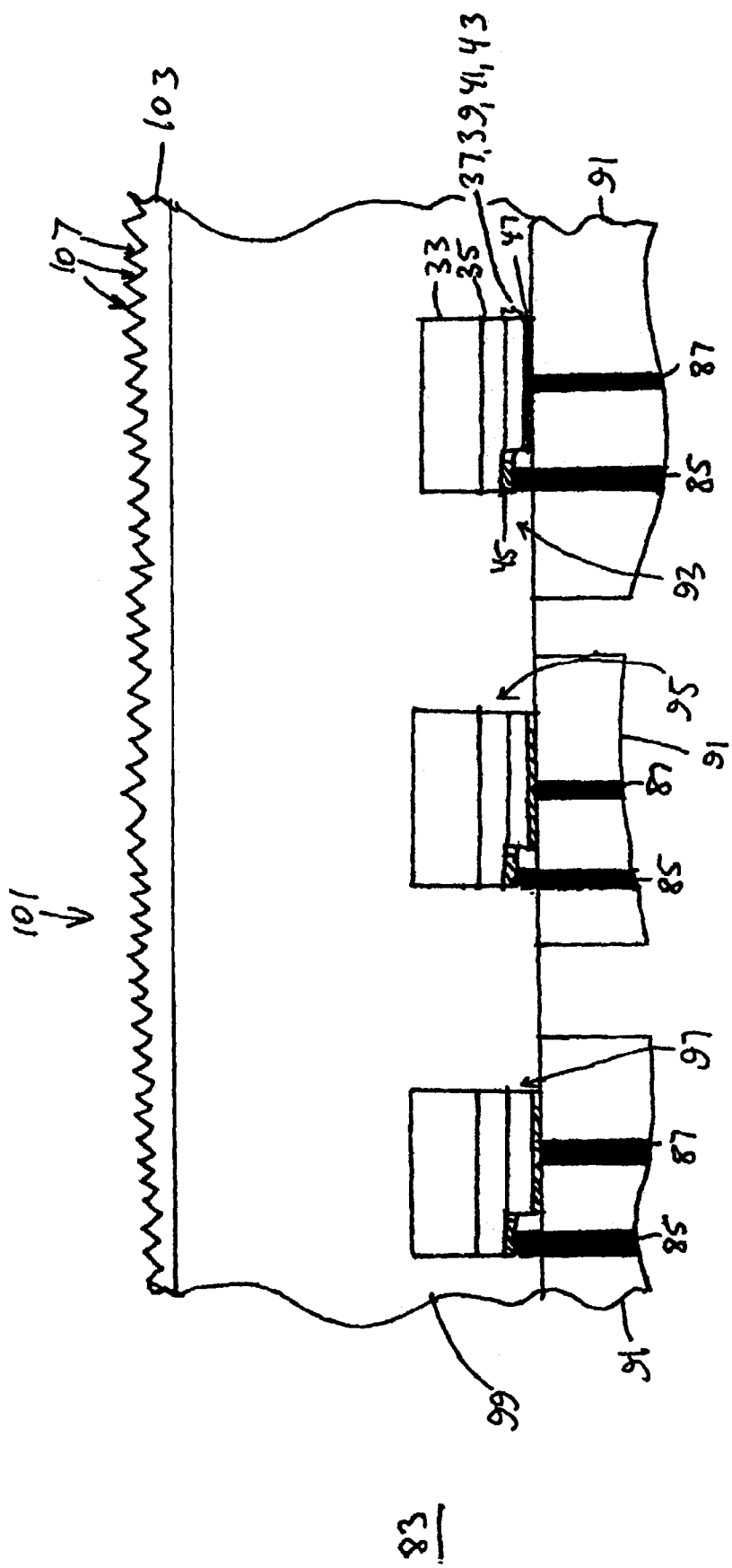

In another preferred embodiment, a flat transparent insulating sheet 103 may be formed over the encapsulating material 99, as shown in FIG. 7. For example, the insulating sheet may comprise a Kapton® sheet made by E.I. DuPont deNemours Co. Thus, the light emitting surface 101 is the top surface of the sheet 103 in the embodiment of FIG. 7. Furthermore, the sheet 103 is preferably flexible. Thus, the sheet 103 may act as a flexible substrate for the array if the LEDs are placed in a plurality of small carriers 91, where each carrier 91 can hold only one or a few LEDs, as illustrated in FIG. 7. The flexible array is advantageous for applications requiring the array to be bent or twisted to be placed into a lighting device housing, such as a cylindrical flashlight shell or a round lamp or traffic light bulb.

A microoptical element is preferably formed adjacent to the light emitting surface 101. Most preferably, the microoptical element is formed in the light emitting surface 101 and integrated as part of the package 83. By integrating the microoptics into the package, the device size is reduced and the manufacturing process is simplified. For example, the microoptical element may be a diffraction grating 105, illustrated in FIG. 6 or a plurality of microprisms 107, illustrated in FIG. 7, or other color and/or intensity mixing microoptics. While the diffraction grating 105 is shown as being formed in the encapsulating material 99 while the microprisms 107 are shown as being formed in the sheet. 103, the diffraction grating 105 may be formed in the sheet 103 and the microprisms may be formed in the encapsulating material 99.

The microoptical elements enhance the color mixing of light beams 53 emitted by the LEDs 93, 95, 97. Furthermore, the color mixing microoptical elements reduce the directional halo effect in white light generated by the blue LEDs and a YAG:Ce$^{3+}$phosphor. The diffraction grating 105 and the microprisms 107 spread out the directional light beams 53 from each LED such that they overlap with the directional light beams 53 emitted by the adjacent LEDs. Thus, the observer perceives the mixed, overlapped emissions from the LED array as a single emission with uniform intensity and color.

The diffraction grating 105 and the microprisms 107 microoptical elements may be formed by various different methods. For example, the microoptical elements may be formed by photolithography and etching. A photoresist mask is formed on the light emitting surface 101 of the encapsulating material 99 or the sheet 103, and the exposed portions of the material 99 or sheet 103 are dry or wet etched to form the microoptical elements. The sheet 101 may be etched before or after being placed into the package 83. The tapered microprism 107 sidewalls may be formed by inductively coupled plasma RIE etching method with angle/taper control. The angle control may be achieved by continuously decreasing the power and/or the amount of reactive ions in the plasma as the etching of sheet 103 proceeds.

Alternatively, the diffraction grating 105 or the microprisms 107 may be formed in surface 101 of the encapsulating material 99 by molding. First a micromachined mold containing a pattern of at least one microoptical element, such as the grating 105 or microprisms 107, is provided. The mold may be made from silicon, with the pattern formed on its surface by photolithography and etching, as described above. The LED array is then placed into the mold and the mold is filled with the encapsulating material 99, such as thermoset or thermoplastic epoxy. The encapsulating material is then solidified (i.e., by heating or cooling, depending on the material type) to form a least one microoptical element in the light emitting surface 101 of the encapsulating material 99. The molding process is preferred because it is simpler than masking and etching each package 83. Furthermore, the encapsulating material 99 molding process is simpler and more cost effective compared to forming an optical element directly in the light emitting diode by photolithography and etching.

D. The Method of Making the LED

Figure 8:
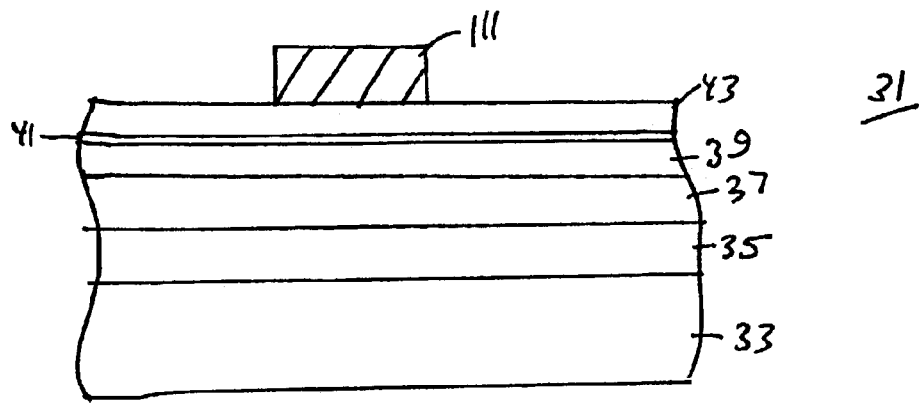
FIGS. 8–10 are side cross section views of a method of making an LED according to one preferred embodiment of the present invention.
Figure 9:
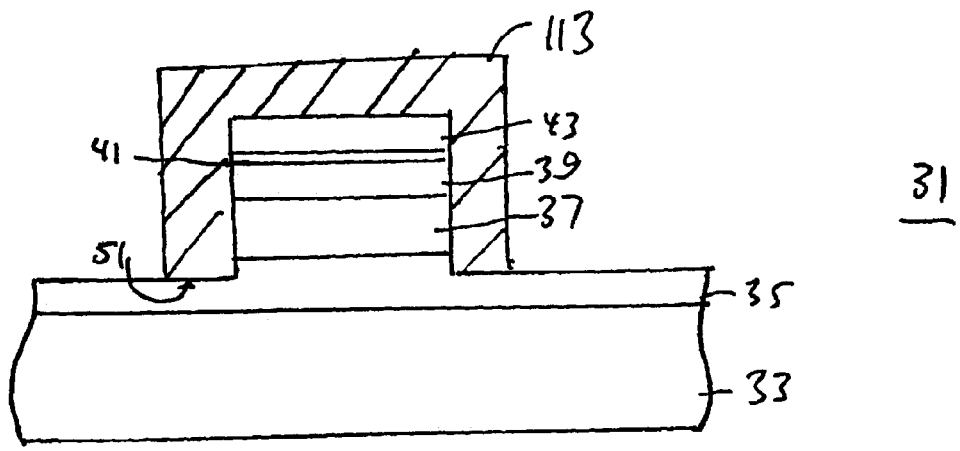
Figure 10:
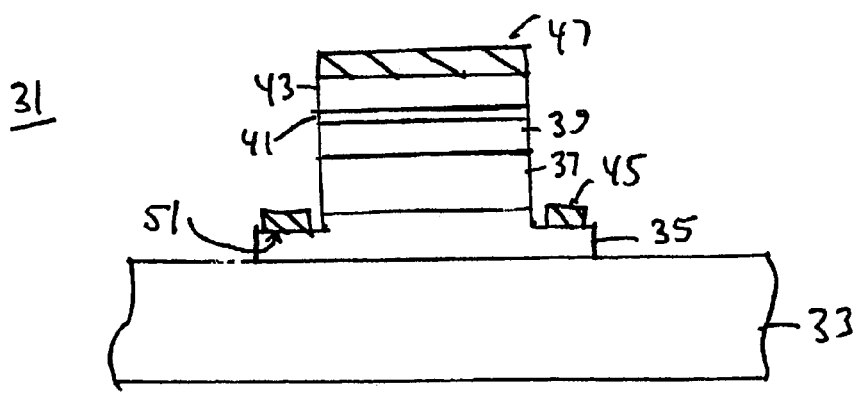

The LEDs 31, 61 illustrated in FIGS. 3 and 5 may be made by any desired method. For example, a method of making the LED 31 according to a first preferred embodiment of the present invention is illustrated in FIGS. 8 to 10. It should be understood that the method of making LED 61 of FIG. 5 is similar, except that the Bragg reflector 37 is omitted, while the confinement layer 39 may be omitted and layer dimensions may be different.

The n-type GaN contact layer 35, the Bragg reflector 37, the n-type confinement layer 39, the active layer 41 and the p-type contact layer 43 are deposited on a sapphire substrate 33 by any deposition method, such as MOCVD, VPE or MBE. A buffer GaN layer may be added between the substrate 33 and layer 35, if desired (not shown). Other layers, such as waveguide layers may also be added, if desired. For example, both the n-type confinement layer 39 and p-type confinement/contact layer 43 could be comprised of multiple layers, including cladding layers. A first photoresist mask 111 is then formed over layer 43, as illustrated in FIG. 8.

The layers 43, 41, 39, 37 and the top portion of layer 35 are patterned by etching, such as RIE, to form a mesa using the first mask 111. The first etching step exposes the contact portion of surface 51 of layer 35. After removing the first mask 111, a second photoresist mask 113, which is wider than the first mask 111, is formed over the LED 31, as illustrated in FIG. 9. Layer 35 is then patterned into a mesa by an etching step such as RIE, as illustrated in FIG. 10.

In the embodiment of FIG. 5, the n-type contact layer 65 preferably contains beveled sidewalls 79 which may be obtained by any taper etching method, such as an inductively coupled plasma RIE etching method with angle/taper control. The angle control may be achieved by continuously decreasing the power and/or the amount of reactive ions in the plasma as the etching of layer 65 proceeds. If desired, the first mesa containing layers 71 and 73 may also be taper etched in the first etching step to produce beveled sidewalls.

Figure 11:
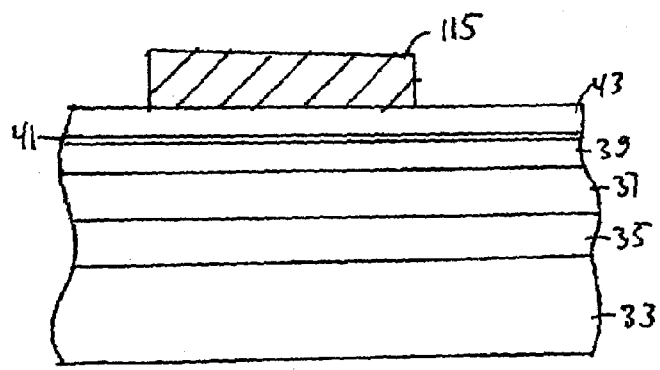
FIGS. 11–12 are side cross sectional views of a method of making an LED according to another preferred embodiment of the present invention.
Figure 12:
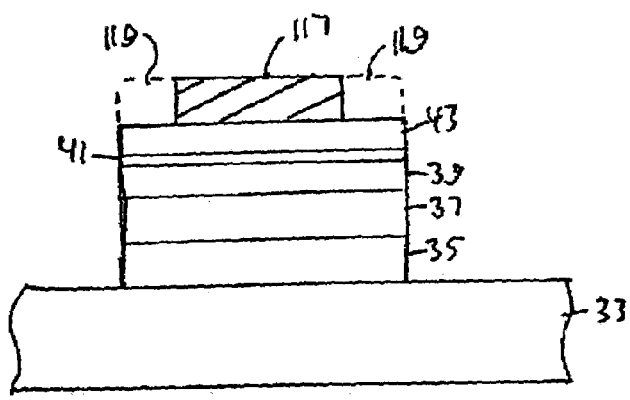

Alternatively, the method according to the second preferred embodiment illustrated in FIGS. 11 and 12 may be used to form the mesa. The n-type GaN contact layer 35, the Bragg reflector 37, the n-type confinement layer 39, the active layer 41 and the p-type contact layer 43 are deposited on a sapphire substrate 33. A first photoresist mask 115 is formed over layer 43. The layers 35, 37, 39, 41 and 43 are then etched, such as by reactive ion etching, to form a mesa, as illustrated in FIG. 11. Then, a second mask 117 is formed over the patterned p-type contact layer 43, as illustrated in FIG. 12. The second mask 117 may be a different, smaller mask than the first mask 115. Alternatively, the second mask 117 may be formed by re-exposing the first mask 115 to light or UV radiation through a different stencil mask followed by removing the outer portions 119 of the first mask 115. The p-type contact layer 43, the active layer 41, the confinement layer 39, the Bragg reflector 37 and the top portion of the n-type contact layer 35 are then etched away to expose the contact portion of the top surface 51 of layer 35, as illustrated in FIG. 10. If tapered sidewalls, such as those illustrated in FIG. 5 are desired, then the first and/or the second etching steps may be controlled to form tapered sidewalls.

After forming the patterned mesa, as illustrated in FIG. 10, the electrodes 45, 75 and 47, 77 are formed over the mesa. Alternatively, electrode 47, 77 is formed and patterned prior to the patterning and etching of the first mesa. For example, the step of forming the first electrode 45 comprises forming at least one metal layer over the contact portion of the first surface of the n-type contact layer 35 and over the p-type contact layer 43, and patterning the at least one metal layer to form a first electrode on the contact portion of surface 51, as illustrated in FIG. 10. Preferably, the step of forming at least one metal layer comprises forming an Al layer and a Ti layer.

Furthermore, the step of forming the first electrode 75 may include forming a reflective layer, such as Ag or Al, over the at least one sidewall 79 and the contact portion of the top surface of the n-type contact layer 65 and over the p-type contact layer 73 and patterning the reflective layer to form a reflective electrode 75 on the at least one sidewall 79 of the n-type contact layer 75, as illustrated in FIG. 5. The reflective Al or Ag layer 75 may be formed above or below the contact metallization 76.

The step of forming the second electrode 47, 77 preferably comprises forming a 100 angstrom or less Ni layer over the p-type contact layer 43, 73 and annealing the Ni layer in oxygen to form a nickel oxide layer, with or without Au dispersed in it, in contact with the p-type contact layer. Then, a reflective Al layer is formed and patterned over the nickel oxide layer to form the second electrode 47, 77. If the first and the second electrodes contain an Al layer, then the Al portion of both electrodes may be formed in the same step. For example, after forming the optional contact metallization 76 and the optional nickel oxide layer, an Al layer is formed over the entire LED and patterned to remain over the p-type contact layer 43, 73 to form the second electrode 47, 77 and to remain over the contact region of the n-type contact layer 35, 65 to form the first electrode 45, 75. Optionally the patterned Al layer 75 may also remain over the sidewall 79 of layer 65, as illustrated in FIG. 5.

If desired, an electrically insulating dielectric passivation layer is deposited over the entire device. It is then patterned and removed in selective areas on the first and second electrodes to allow formation of an electrical contact to the first and second leads. After forming the electrodes and the optional passivation layer, the substrate 33, 63 is scribed and broken, sawed or cut by a laser to form a plurality of light emitting diode chips. The chips are packaged to form the packaged LED array, as described above and as illustrated in FIGS. 6 and 7.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept. Furthermore, the figures are provided for the purpose of illustration and are not necessarily drawn to scale.

What is claimed is:

1. A method of making a packaged light emitting diode, comprising:

forming a first conductivity type semiconductor contact layer on a transparent substrate;

forming a semiconductor active layer over a first surface of the first conductivity type semiconductor contact layer;

forming a second conductivity type semiconductor contact layer over the active layer;

patterning the first conductivity type semiconductor layer, the second conductivity type semiconductor contact layer and the active layer;

forming a first metal containing electrode contacting the first conductivity type semiconductor contact layer;

forming a second metal containing electrode contacting the second conductivity type semiconductor contact layer to yield a light emitting diode; and forming a packaged light emitting diode containing at least one integrated microoptical element above the light emitting diode, wherein forming the packaged light emitting diode comprises:

mounting the light emitting diode in a flip chip configuration on a package, wherein the first electrode electrically contacts a first lead on the package, the second electrode electrically contacts a second lead on the package and the substrate is positioned toward a light emitting surface of the package;

forming a transparent encapsulating material layer over the transparent substrate, through which light from the light emitting diode passes;

forming a flexible sheet over the encapsulating material layer; and etching the at least one microoptical element on the flexible sheet, through which light from the light emitting diode passes after passage through the encapsulating material layer.

2. The method of claim 1, wherein the microoptical element comprises a diffraction grating or a plurality of prisms.

3. The method of claim 2, wherein the light emitting surface of the encapsulating material is substantially flat and does not contain a dome lens.

4. The method of claim 1, wherein:

the substrate comprises a material which is transparent to the radiation emitted by the active layer;

the first conductivity type semiconductor contact layer comprises an n-type III–V semiconductor contact layer containing Ga and N;

the active layer comprises at least one III–V semiconductor quantum well containing In, Ga and N;

the second conductivity type semiconductor contact layer comprises a p-type III–V semiconductor contact layer containing Ga and N;

the first electrode contacts the first surface of the n-type contact layer.

5. The method of claim 4, further comprising:

determining a desired tuned peak radiation output wavelength, $\lambda 0$, of the light emitting diode;

selecting a band gap of the GaInN quantum well active layer such that the light emitting diode emits radiation substantially in one direction through the transparent substrate at a peak wavelength of $\lambda 0$;

forming a Bragg reflector above the n-type contact layer, the Bragg reflector comprising a plurality of alternating first and second layers, each having a thickness of $\lambda 0/4n$, where n is an integer, such that the Bragg reflector reflectivity is less than the reflectivity of the second electrode; and forming a resonant cavity comprising the p-type contact layer, the active layer, and an n-type confinement layer, and having a thickness of $t=[\lambda 0*(2*N*\pi-\phi OUTPUT-\phi BACK)]/(4*\pi*n)$ or a thickness of $t=N\lambda 0/2n$, where N is an integer, $\lambda 0$ is the resonant cavity light emitting diode tuned peak radiation output wavelength in air, n is the effective refractive index of the cavity, and $\phi OUTPUT$ and $\phi BACK$ are the phase changes during reflection at the first Bragg reflector and second electrode.

6. The method of claim 4, further comprising:

determining the desired tuned peak radiation output wavelength, $\lambda 0$, of the light emitting diode;

selecting a band gap of the GaInN quantum well active layer such that the light emitting diode emits radiation substantially in one direction through the transparent substrate at a peak wavelength of λ1<λ0;

forming a Bragg reflector above the n-type contact layer, the Bragg reflector comprising a plurality of alternating first and second layers, each having a thickness of λ0/4n, where n is an integer, such that the Bragg reflector reflectivity is less than the reflectivity of the second electrode; and forming a resonant cavity comprising the p-type contact layer, the active layer and an n-type confinement layer, and having a thickness of $t=[\lambda 0 * (2*N*\pi - \phi OUTPUT - \phi BACK)]/(4*\pi*n)$ or a thickness of $t=N\lambda 0/2n$, where N is an integer, λ0 is the resonant cavity light emitting diode tuned peak radiation output wavelength in air, n is the effective refractive index of the cavity, and ϕOUTPUT and ϕBACK are the phase changes during reflection at the first Bragg reflector and second electrode.

7. The method of claim 4, wherein:

the step of patterning comprises patterning the p-type contact layer, the active layer and a top portion of the n-type contact layer in the same patterning step to expose a contact portion of the first surface of the n-type contact layer; and the step of forming the first electrode comprises forming at least one metal layer over the contact portion of the first surface of the n-type contact layer and over the p-type contact layer and patterning the at least one metal layer to form the first electrode on the contact portion.

8. The method of claim 7, further comprising forming a reflective layer over the at least one sidewall and the contact portion of the first surface of the n-type contact layer and over the p-type contact layer and patterning the reflective layer to form a reflective electrode on the at least one sidewall of the n-type contact layer.

9. The method of claim 8, wherein the step of forming the first electrode and the step of forming the second electrode comprises forming an aluminum layer over the first and the second conductivity type contact layers and patterning the aluminum layer to form the first and the second electrodes.

10. The method of claim 4, wherein:

the step of patterning occurs after the step of forming the second metal containing electrode; and the step of patterning comprises:

forming a first mask over the p-type contact layer;

etching the p-type contact layer, the active layer and a top portion of the n-type contact layer to expose a contact portion of the first surface of the n-type contact layer;

forming a second mask over the patterned p-type contact layer and the active layer and over the contact portion of the first surface of the n-type contact layer; and reactive ion etching the n-type contact layer to form the n-type contact layer with a circular or oval cross section containing one beveled sidewall, where a second surface of the n-type contact layer is wider than the first surface of the n-type contact layer.

11. The method of claim 4, wherein the step of patterning comprises:

forming a first mask over the p-type contact layer;

reactive ion etching the p-type contact layer, the active layer and the n-type contact layer to form a mesa with a circular or oval cross section containing one beveled sidewall, where a second surface of the n-type contact layer is wider than the first surface of the n-type contact layer;

forming a second mask over the patterned p-type contact layer; and etching the p-type contact layer and the active layer to expose a contact portion of the first surface of the n-type contact layer.

12. The method of claim 4, further comprising:

forming a passivation layer;

sawing, scribe-breaking or laser cutting the transparent substrate to form a plurality of light emitting diode chips emitting different color of light; and packaging the plurality of light emitting diode chips in an array.

13. A method of packaging a light emitting diode (LED), comprising:

mounting the LED on a package in a flip chip configuration, wherein:

a first electrode of the LED electrically contacts a first lead of the package;

a second electrode of the LED electrically contacts a second lead of the package;

a transparent substrate of the LED is positioned toward a light emitting surface;

forming a transparent encapsulating material layer over the transparent substrate, through which light from the light emitting diode passes;

forming a flexible sheet over the encapsulating material layer; and etching the at least one microoptical element on the flexible sheet, through which light from the light emitting diode passes after passage through the encapsulating material layer.

* * * * *